(12) United States Patent
Yilmaz et al.

(10) Patent No.: US 7,369,722 B2
(45) Date of Patent: May 6, 2008

(54) COUPLED AND NON-COUPLED OPTO-ELECTRONIC OSCILLATORS WITH ENHANCED PERFORMANCE

(75) Inventors: Ismail Tolga Yilmaz, Oviedo, FL (US); Danny Eliyahu, Pasadena, CA (US); Dmitri A. Kossakovski, South Pasadena, CA (US); Lutfollah Maleki, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 218 days.

(21) Appl. No.: 11/384,002

(22) Filed: Mar. 17, 2006

(65) Prior Publication Data

US 2007/0153289 A1    Jul. 5, 2007

Related U.S. Application Data

(60) Provisional application No. 60/756,601, filed on Jan. 4, 2006, provisional application No. 60/662,963, filed on Mar. 17, 2005.

(51) Int. Cl.
*G02B 6/26* (2006.01)

(52) U.S. Cl. ............................................. 385/27; 385/1
(58) Field of Classification Search ................... 385/1, 385/27
See application file for complete search history.

(56) References Cited

U.S. PATENT DOCUMENTS

| | | | | |
|---|---|---|---|---|
| 5,723,856 | A * | 3/1998 | Yao et al. | 250/227.11 |
| 5,777,778 | A * | 7/1998 | Yao | 359/245 |
| 5,929,430 | A * | 7/1999 | Yao et al. | 250/205 |
| 6,567,436 | B1 * | 5/2003 | Yao et al. | 372/32 |

\* cited by examiner

*Primary Examiner*—Sarah Song
(74) *Attorney, Agent, or Firm*—Fish & Richardson P.C.

(57) ABSTRACT

This application describes coupled and non-coupled opto-electronic oscillators with enhanced performance. Coupled OEOs implement a dispersion compensation mechanism to reduce dispersion-induced optical loss, a polarization control mechanism to reduce polarization-dependent optical loss, or a combination of the dispersion compensation mechanism and the polarization control mechanism to enhance the oscillator performance.

17 Claims, 13 Drawing Sheets

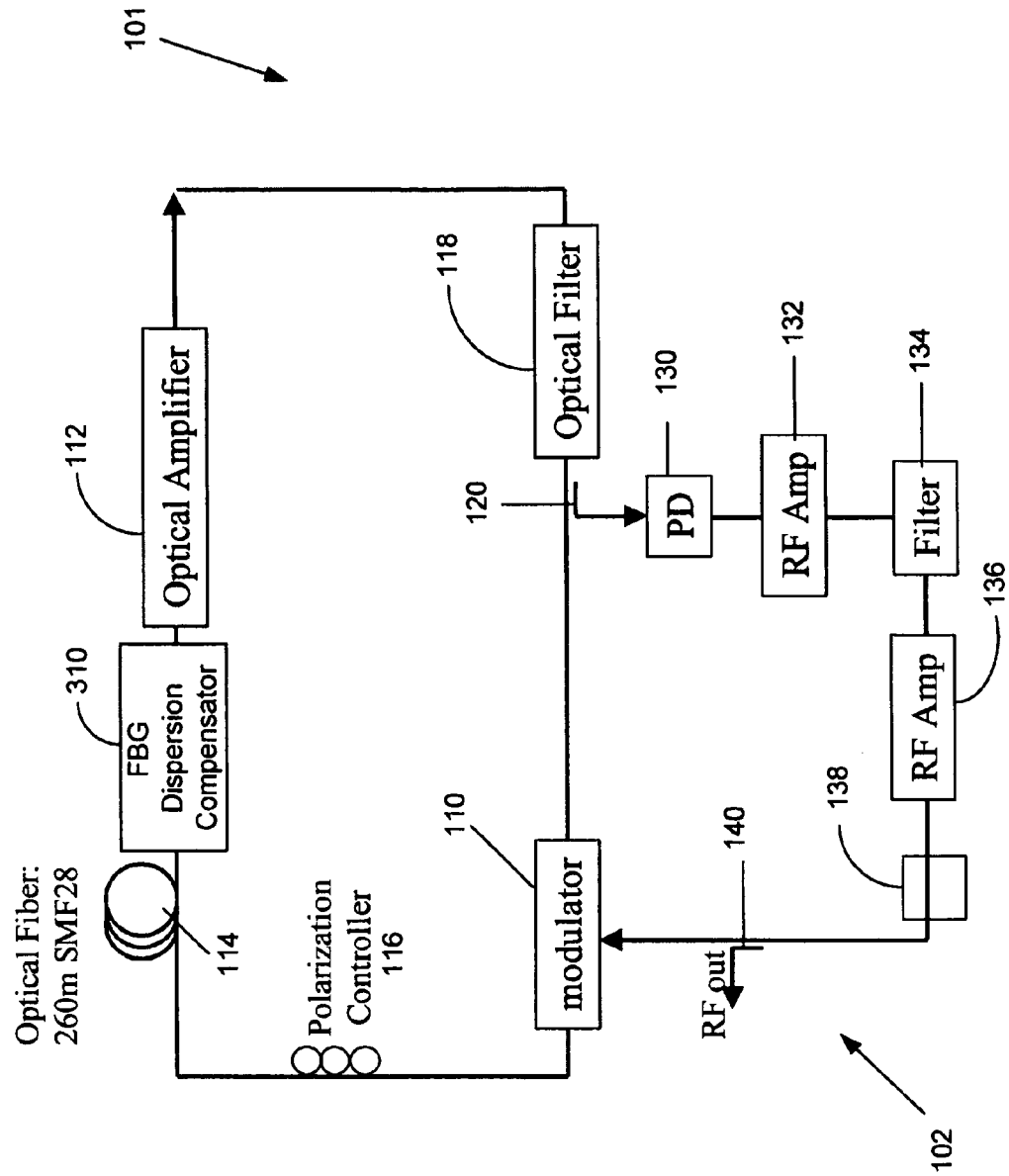

COUPLED AND NON-COUPLED OPTO-ELECTRONIC OSCILLATORS WITH ENHANCED PERFORMANCE

This application claims the benefits of the following two U.S. Provisional Applications:

No. 60/662,963 entitled "COUPLED OPTO-ELECTRONIC OSCILLATORS WITH DISPERSION COMPENSATION" and filed Mar. 17, 2005, and No. 60/756,601 entitled "Dual Loop OEO/COEO Utilizing One Photodetector" and filed Jan. 4, 2006.

The above two applications are incorporated by reference as part of the specification of this application.

BACKGROUND

This application relates to optical and photonic devices for various applications, such as optical, radio frequency (RF), and microwave applications.

RF and microwave oscillators for generating signals in the RF and microwave frequencies may be constructed as "hybrid" devices by using both electronic and optical components to form opto-electronic oscillators ("OEOs"). See, e.g., U.S. Pat. Nos. 5,723,856, 5,777,778, 5,929,430, and 6,567,436. Such an OEO includes an electrically controllable optical modulator and at least one active opto-electronic feedback loop that comprises an optical part and an electrical part interconnected by a photodetector. The opto-electronic feedback loop receives the modulated optical output from the modulator and converted the modulated optical output into an electrical signal which is applied to control the modulator. The feedback loop produces a desired long delay in the optical part of the loop to suppress phase noise and feeds the converted electrical signal in phase to the modulator to generate the optical modulation and generate and sustain an electrical oscillation in RF or microwave frequencies when the total loop gain of the active opto-electronic loop and any other additional feedback loops exceeds the total loss. The generated oscillating signals are tunable in frequency and can have narrow spectral linewidths and low phase noise in comparison with the signals produced by other RF and microwaves oscillators.

SUMMARY

This application describes coupled and non-coupled opto-electronic oscillators with enhanced performance. Described coupled opto-electronic oscillators implement a dispersion compensation mechanism to reduce dispersion-induced optical loss, a polarization control mechanism to reduce polarization-dependent optical loss, or a combination of the dispersion compensation mechanism and the polarization control mechanism to enhance the oscillator performance. Some configurations of the coupled opto-electronic oscillators described here may be used to shorten the optical length of the optical loop and thus to reduce the spurious modes in the generated electrical oscillation spectrum.

In one implementation, a device is described to include a ring laser comprising an optical ring which comprises at least one optical gain medium operable to produce laser light at a laser carrier frequency; an optical modulator coupled in the optical ring and operable to modulate the laser light in response to a control signal to produce a modulated laser beam; an opto-electronic feedback loop comprising an optical portion operable to receive a portion of light from the ring laser, a photodetector operable to convert the received portion of light into a detector signal, and an electrical portion operable to produce the control signal from the detector signal; and a dispersion compensation element coupled in the optical ring and operable to compensate for optical dispersion in the optical ring.

In another implementation, a device is described to include an optical loop which comprises at least one optical gain medium operable to produce laser light; an optical modulator coupled in the optical loop and operable to modulate the laser light in response to a control signal to produce modulated laser light; and an opto-electronic feedback loop comprising an optical portion operable to receive a portion of the modulated laser light from the optical loop, a photodetector operable to convert the received portion into a detector signal, and an electrical portion operable to produce the control signal from the detector signal. This device further includes an optical polarization beam splitter coupled in the optical loop to direct light received from the optical loop into a first light beam; a 45-degree Faraday rotator to receive and transmits the first light beam; a reflective unit to reflect the first light beam transmitted through the Faraday rotator back to the optical polarization beam splitter by transmitting through the Faraday rotator for a second time; and a fiber delay line between an optical path between the optical polarization beam splitter and the reflective unit to transport light. The optical polarization beam splitter is coupled to the optical loop to direct light reflected back from the reflective unit into the optical loop.

This application also describes opto-electronic oscillators that include a laser to produce CW laser light; an optical modulator to modulate the CW laser light to produce modulated laser light in response to an electrical control signal; an optical splitter to receive at least a portion of the modulated laser light and to split the received portion into a first beam and a second beam; a first optical delay path to receive the first beam; a second optical delay path to receive the second beam, wherein the first and second optical paths have different optical delays; a photodetector which is coupled to receive the first and second beams, at orthogonal polarizations, from the first and second optical delay paths to produce a detector signal; and an electrical section operable to receive and process the detector signal to produce the electrical control signal. The electrical section, the optical modulator, the optical splitter, the first and second optical delay paths, and the photodetector form a part of a closed opto-electronic feedback loop that is operable to have a loop gain greater than the loop loss and to generate an oscillation at a modulation frequency of the optical modulator.

These and other implementations and other features are described in greater detail in the drawings, the detailed description and the claims.

BRIEF DESCRIPTION OF DRAWINGS

FIGS. 1, 2 and 3 show examples of coupled opto-electronic oscillators that use a dispersion compensation mechanism and a polarization control mechanism to achieve a shortened optical loop and a low phase noise.

DETAILED DESCRIPTION

Figure 1:
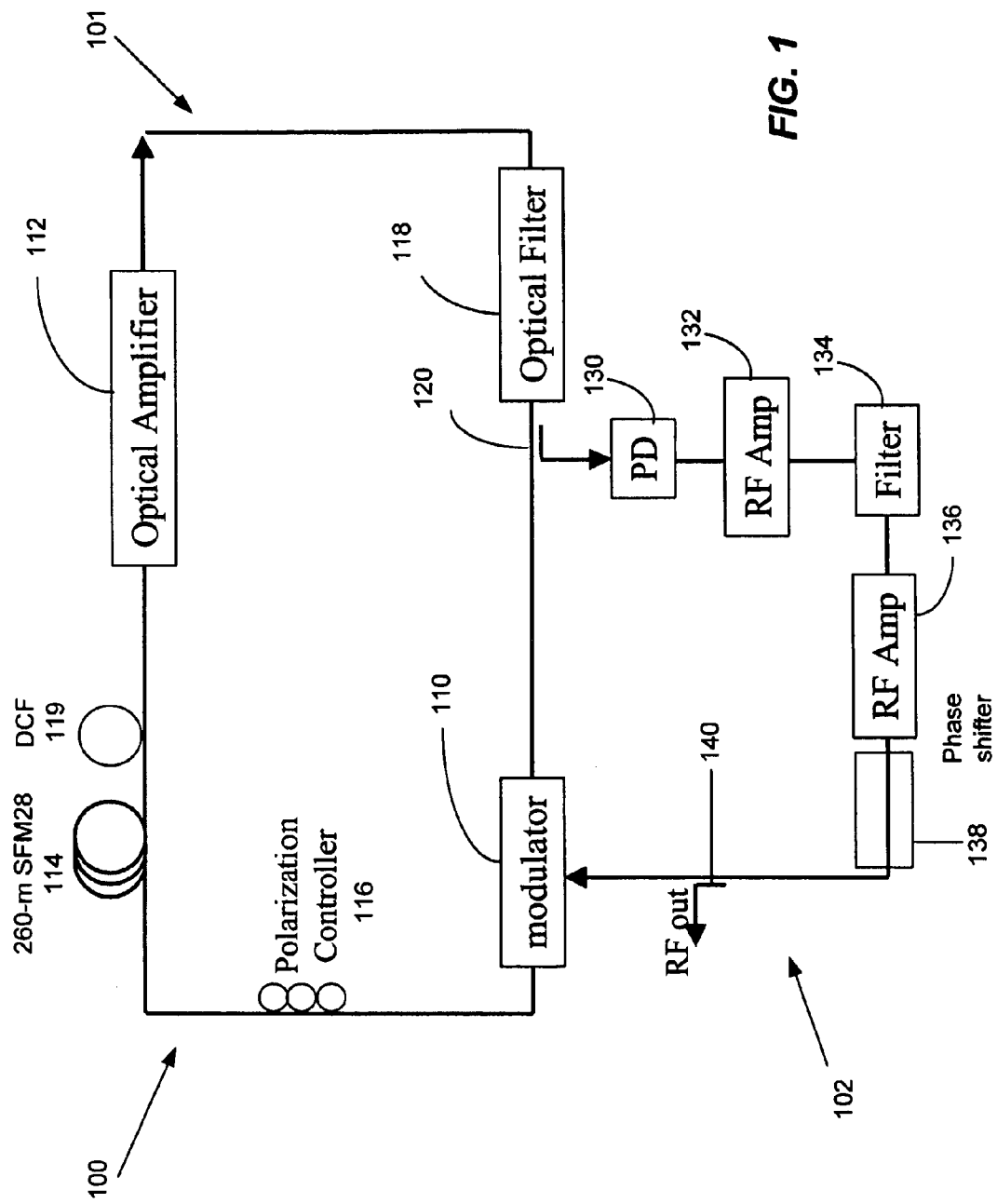

An OEO may be configured as a coupled opto-electronic oscillator (COEO) which directly couples a laser oscillation in an optical feedback loop (e.g., a laser cavity) to an electrical oscillation in an opto-electronic feedback loop. See, e.g., U.S. Pat. No. 5,929,430 which describes some examples of COEOs and is incorporated by reference in its entirety as part of this application. The laser oscillation and the electrical oscillation are correlated with each other so that both the modes and stability of one oscillation are coupled with those of the other oscillation. The optical feedback loop includes an optical gain medium (i.e., laser medium) and is a positive feedback loop to produce a sufficient optical gain greater the total optical loss to effectuate the laser oscillation in the optical feedback loop. This optical loop may be in a Fabry-Perot resonator, a ring resonator, and other optical resonator configurations. The optical gain medium may be excited or energized by an optical pump beam such as an ion-doped fiber optical amplifier or by an electrical source such as a semiconductor optical amplifier (SOA) excited by an electrical driving current. Multiple optical modes (i.e., the longitudinal modes) of the laser feedback loop can exist and the optical mode spacing of two adjacent optical modes spacing is determined by the optical length of the optical loop and is inversely proportional to the optical length of the optical loop. These optical modes tend to be independent from one another in phase. Hence, in absence of the opto-electronic feedback loop, the laser oscillation may occur at multiple optical modes and is a continuous wave (CW) laser oscillation.

The opto-electronic loop in COEO is configured as a positive feedback loop and has a total loop gain greater than the total loop loss to sustain the electrical oscillation. The coupling between two feedback loops is achieved by an optical modulation of an optical parameter of the optical loop (e.g., the optical gain or loss) at a modulation frequency equal to the oscillation frequency of the opto-electronic feedback loop. The electrical signal in the opto-electronic feedback loop is applied as a control signal to control the optical modulation. This optical modulation modulates each optical mode to create modulation sidebands on both sides of each optical mode. This optical modulation can cause mode locking of different optical modes in the optical loop when the modulation frequency is equal to the optical mode spacing or a multiplicity of the optical mode spacing of the optical modes in the optical loop because the sidebands of each modulated mode coincide with its neighboring bands. The mode locking causes the laser light to be an pulsed output in the time domain. After the mode locking is established, the actual mode spacing of the laser oscillation is equal to the frequency of the opto-electronic loop.

Therefore, the laser oscillation and the electrical oscillation in the COEO are correlated with each other in a way that the gain in the electrical oscillation in the opto-electronic feedback loop is partially obtained from the optical gain in the optical loop and the phase noise of the electrical oscillation can be suppressed via a long optical delay in the optical portion of the opto-electronic loop. Accordingly, the electrical oscillation in the COEO can exhibit a high quality factor and a low phase noise level that are difficult to achieve with other RF oscillators without the oscillating opto-electronic feedback loop. Some applications require a low phase noise of about or less than −140 dBc/Hz at 10 kHz offset and the corresponding length of the fiber for a sufficiently long delay in a COEO is on the order of several kilometers.

The optical portion of the opto-electronic feedback loop includes at least the optical loop and may also include an additional optical delay line that separate from the optical loop to further cause delay for an optical signal extracted out of the optical loop. When the optical loop for the laser oscillation is used as the primary source for the long optical delay in order to decrease the phase noise, the spacing of the optical modes in the laser oscillation is small. In a COEO which oscillates at a frequency equal to a multiplicity of the optical mode spacing, an optical mode that does not coincide with an oscillation mode of the opto-electronic feedback loop may not be completely suppressed by the mode matching in the coupled optical loop and the opto-electronic loop and thus may be present as a spurious mode in the spectrum of the electrical oscillation signal. When the optical loop is a fiber ring to form a ring laser, an acceptable phase noise level in such a COEO in some application corresponds to a fiber length for the ring of about a few kilometers, e.g., 2 km. A 2-km fiber loop creates an optical mode spacing of about 100 kHz. For an RF oscillation at 1 GHz, a spurious mode at 100 kHz from the RF away the RF carrier may impose serious technical difficulties in device designs (e.g., difficulty in RF signal filtering) and device performance in some applications.

Therefore, it is desirable to design the COEO with a short optical loop for the laser oscillation in order to create a sufficiently large optical mode spacing for the optical modes in the laser oscillation so that the spurious modes are spaced with a sufficiently large frequency separation from an RF carrier in the electrical oscillation signal. This use of a short optical loop for the laser oscillation apparently is in conflict with the need for a long optical delay in the opto-electronic feedback loop to reduced the phase noise the electronic oscillation signal.

The above seemingly conflicting requirements for the optical length of the optical loop in the COEO, however, can be resolved by properly designing the optical components of the COEO. The low phase noise performance of a long optical loop in the COEO is at least in part contributed by the effective high quality Q factor of the optical loop. The high Q factor of the optical loop can be achieved by using a shorter optical loop by reducing optical loss in the optical loop. As an example, one cause for the optical loss in the optical loop in the COEO is the optical dispersion which increases the phase between optical modes, resulting in spreading and widening of the short optical pulse and reduction of the mode locking efficiency. Thus, the optical dispersion reduces the effective Q factor of the optical loop. In previous COEO designs using a fiber ring to construct the optical loop for generating the laser oscillation, the optical dispersion of the fiber was not addressed. The reduction in Q enhancement caused by the optical dispersion was offset by—using a long fiber ring with a large optical delay.

One way to address the above seemingly conflicting requirements for the optical length of the optical loop in the COEO is to provide a dispersion compensation mechanism in the optical loop for the laser oscillation so that a high quality Q factor can be achieved with a shorter optical length for the optical loop in comparison with an optical loop of a similar loop construction without the dispersion compensation mechanism. This use of the dispersion compensation mechanism in the optical loop of the COEO can be used to achieve a desired large optical mode spacing of the optical loop while still maintaining a desired low phase noise level and a high Q factor for the COEO.

FIG. 1 shows one implementation of a COEO 100 using a dispersion compensated ring laser design for a closed optical loop that internally produces an optical gain. The COEO 100 includes an optical fiber ring 101 and an optoelectronic feedback loop 102 which contains the fiber ring 101 as part of its optical portion. The ring 101 forms a ring laser and includes an optical modulator 110, an optical gain medium or optical amplifier 112, and an optical coupler 120 for producing an optical feedback signal from the laser light in the ring 101. An optical filter 118 may also be included in the ring 101. The optical modulator 110 is operable to performs an optical modulation to cause the mode locking of different longitudinal modes of the ring cavity and may an amplitude modulator or a phase modulator. An opto-electronic feedback loop 102 is formed in the COEO 100 by the optical fiber ring 101, the optical coupler 120, an optical path to receive the coupled optical feedback signal, an optical detector or photodetector (PD) 130 to covert the optical feedback signal into an electrical signal and an electrical portion to produce an electrical control signal form the electrical signal output by the optical detector 130 to control the optical modulator 110. In the illustrated example, the photodetector 130 is the interface between the optical portion and the electrical portion of the opto-electronic feedback loop. The electrical portion of the opto-electronic feedback loop 102 includes RF amplifiers 132 and 136 to amplify the signal and an RF filter 134 to filter the signal. In some implementations, a variable signal phase shifter 138 (e.g., a voltage-controlled RF phase shifter) or an RF line stretcher may be included in the electrical portion to adjust the phase of the control signal to the optical modulator 110 so that the proper mode matching condition is met by overlapping an oscillation mode of the opto-electronic feedback loop 102 with an optical mode of the optical loop 101 and to ensure that the control signal is a positive feedback to initiate and sustain the opto-electronic oscillation. Other OEOs and COEOs described in this application can also include such a phase shifter 138. Alternatively, the phase delays in the COEO can be predetermined and fixed in the final COEO to ensure the proper feedback phase in the opto-electronic feedback loop and the proper mode matching condition. An RF signal coupler 140 may also be included in the electrical portion of the opto-electronic feedback loop to output the electronic oscillation signal of the COEO 100. In operation, the opto-electronic feedback loop 102 uses at least one portion of the laser light generated in the optical ring 101 to generate the control signal for controlling the optical modulator 110.

The optical fiber ring 101 can include a length of single mode fiber (SMF) 114 to which various optical elements in the ring are coupled. This fiber may be a polarization maintaining (PM) fiber. Notably, a dispersion compensation element 119 is included in the fiber ring 101 to produce optical dispersion that negates the optical dispersion present in the ring 101 so that the net optical dispersion in the ring 101 is minimized and the optical length of the ring 101 can be shortened to achieve a desired large optical mode spacing. The dispersion compensation element 119 may be implemented in various configurations, including a dispersion compensation fiber (DCF), a dispersion shifted fiber, and a fiber Bragg grating dispersion compensator.

In the specific example in FIG. 1, a segment of single mode fiber of 260 meters using the Corning SMF28 fiber is used as the fiber 114 to form the fiber ring 101. The dispersion compensation element 119 is a segment of dispersion compensation fiber (DCF) of 40 meters and is spliced to the fiber 114. The lengths of the fiber segments 114 and 119 used in this example are determined based on the desired total optical length of the fiber ring 101 for the optical mode spacing and the need to minimize the total optical dispersion in the ring 101. The DCF is effectively an additional length of a different fiber with abnormal dispersion that negates the dispersion in the fiber ring. The exact length of DCF can be calculated based on the characteristics of the main fiber. This design may be performed in two steps. First, the length of the optical ring is initially designed to be sufficiently short to achieve the minimum separation between the carrier and the first spurious mode. Next, based on the set short length of the optical ring, the dispersion compensation element is designed to compensate for the dispersion in the fiber ring to reduce the phase noise below an acceptable level that can be otherwise achieved with a longer length for the optical ring. This approach is based on the fact that if the chromatic dispersion of the fiber is compensated then the dispersion-compensated fiber's behavior in phase noise is effectively like a longer fiber in an active lasing system like the optical ring in FIG. 1. This dispersion compensated fiber ring can produce a Q factor similar to that of a fiber ring of about 4 km (or longer) formed with the Corning SFM28 fiber without dispersion compensation. The addition of the dispersion compensation element in the optical ring does not significantly change the frequency spacing between the carrier and the first spurious mode, which is dictated by the shorted length of the optical ring.

Figure 2:
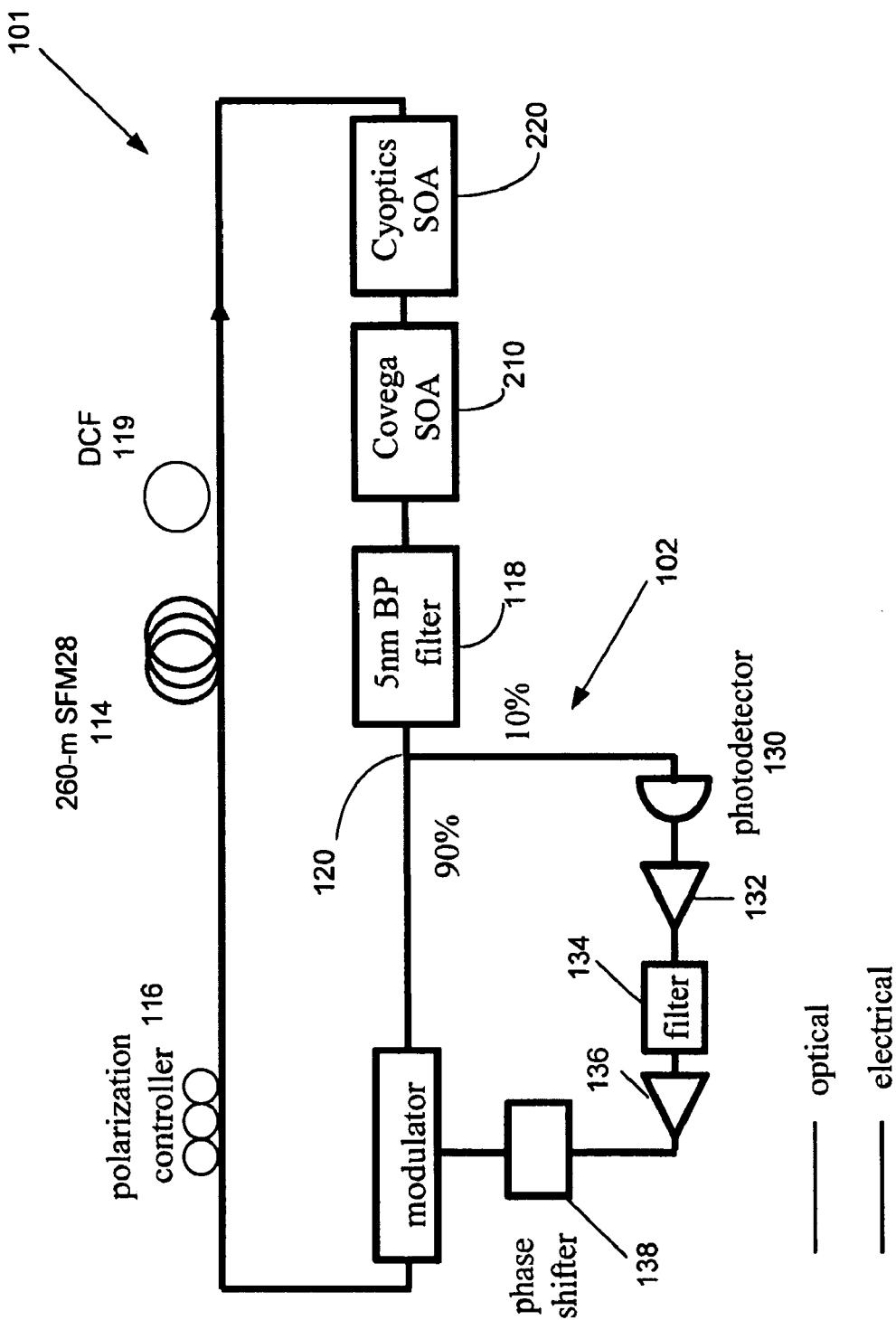

FIG. 2 shows an implementation of the COEO in FIG. 1, where two semiconductor amplifiers 210 and 220 are used as the optical gain medium 112 in FIG. 1 to generate laser light. An optical bandpass (PB) filter (e.g., with a transmission band of 5 nm) is used to implement the filter 118 to suppress light and optical noise outside the laser frequency. In both FIGS. 1 and 2, the optical modulator 110 is a separate device from the optical gain medium (SOAs in this example) and modulates the laser light generated in the optical ring at an oscillation frequency below the optical spectrum, e.g., a RF or microwave frequency. Alternatively, the optical modulator 110 may be a SOA to both amplify laser light and to modulate the laser light in the fiber ring 101. The optical coupler 120 may be an optical splitter such as a 90/10 optical splitter as shown.

The dispersion compensation element 119 in FIGS. 1 and 2 may also be implemented by one or more fiber Bragg grating (FBG) dispersion compensators in the optical ring 101 for dispersion compensation. A fiber Bragg grating compensator may be formed in a PM fiber that is used to form the optical ring 101 in the COEO in FIG. 1 or 2. The fiber Bragg grating may have a spatially chirped grating period along the grating to produce different dispersions at different wavelengths to negate the dispersion in the fiber ring 101. In addition to dispersion compensation, the fiber Bragg grating itself can also operate as an optical wavelength filter and thus eliminates the need for a separate optical filter in the loop 101.

Figure 4A:
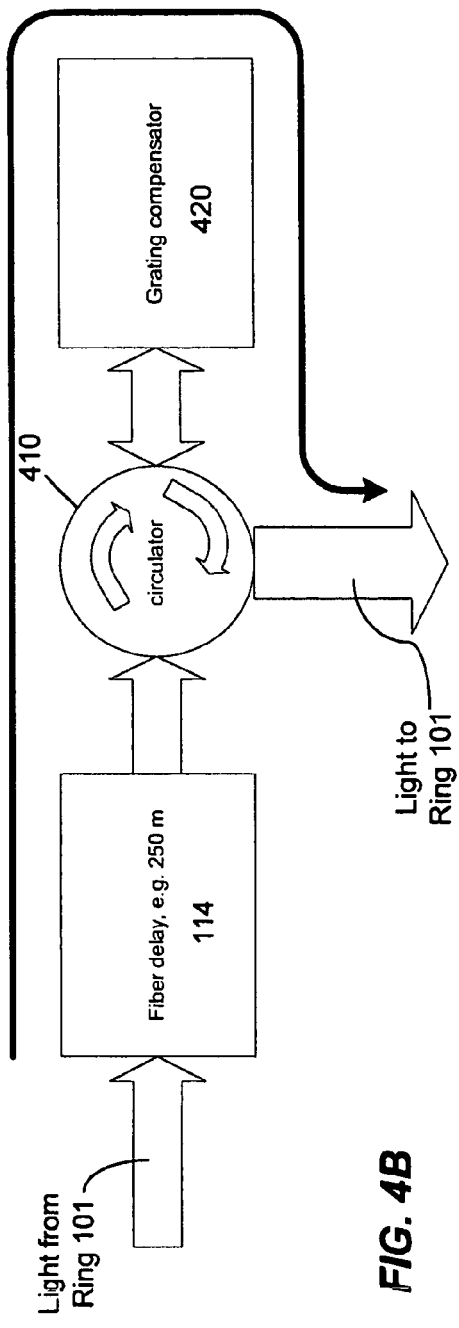
FIGS. 4A and 4B show two implementations of a fiber Bragg grating dispersion compensator in the device in FIG. 3.
Figure 4B:
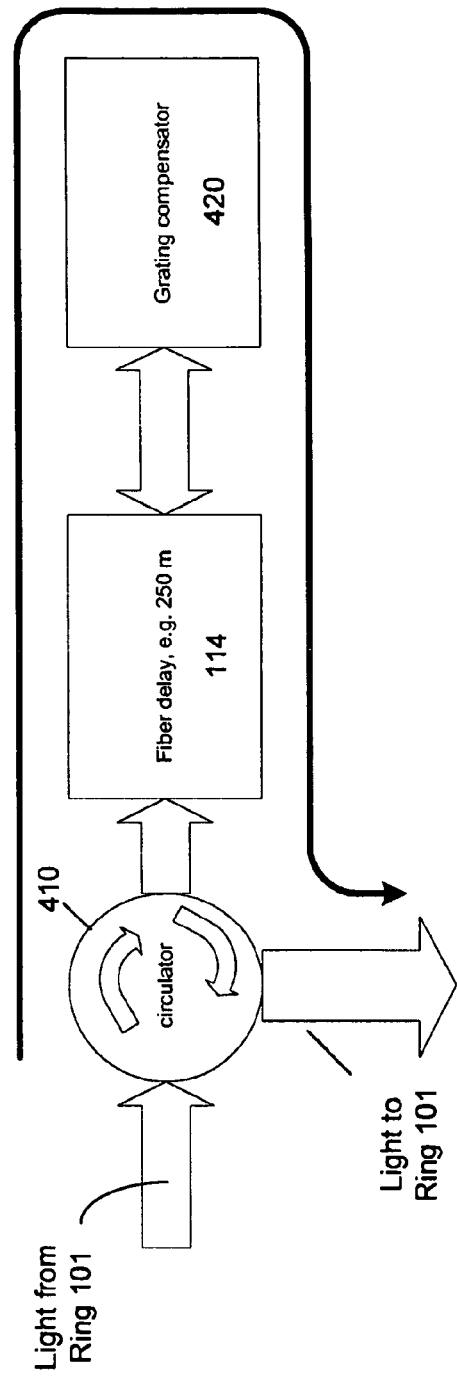

FIG. 3 illustrates a COEO that is based on the design in FIG. 1 and implements a FBG dispersion compensator 310 in the ring 101. FIG. 4A further shows one implementation of the FBG dispersion compensator 310 which includes an optical circulator 410 and a fiber Bragg grating 420. The circulator 410 is connected to receive light out of the fiber delay line 114 and directs the received light into the fiber Bragg grating 420. The fiber Bragg grating 420 reflects the light from the circulator 410 to produce reflected light with reduced dispersion. The reflected light is received by the circulator 410 and is directed back into the fiber ring 101. FIG. 4B shows a different implementation where the fiber delay line 114 is coupled between the optical circulator 410 and the fiber Bragg grating 420. The fiber Bragg grating 420 in both implementations is configured to minimize the dispersion on the light that is coupled back to the ring 101.

In the COEOs in FIGS. 1-3 and other configurations, a certain part of the optical loop 101 can be sensitive to optical polarization and thus may experience polarization-dependent optical loss if the polarization is not at a particular polarization state. For example, the optical modulator 110 and the optical gain medium 112 in the COEOS in FIGS. 1-3 may be sensitive to polarization of light. This polarization-dependent optical loss contributes to the overall optical loss in the optical loop 101 and thus can reduce the effective Q factor of the optical loop and the COEO. Therefore, a polarization control mechanism may be implemented in the COEO to reduce the optical loss in the optical loop 101 and to enhance the effective Q factor of the COEO. The polarization control mechanism may be implemented either in a combination with the dispersion compensation in a COEO or without the dispersion compensation.

The COEOS in FIGS. 1-3 show a polarization controller 116 coupled in the optical loop 101 to control the polarization of the light in the ring 101, thus minimizing the polarization-sensitive optical loss. In operation, the polarization controller 116 is adjusted to minimize the overall optical loss in the fiber ring 101. In some implementations, each polarization-sensitive location in the fiber ring 101 may include a designated polarization controller to ensure the proper polarization at that location, e.g., one at the entrance of the optical modulator 110 and another at the entrance of the optical amplifier 112.

Figure 5:
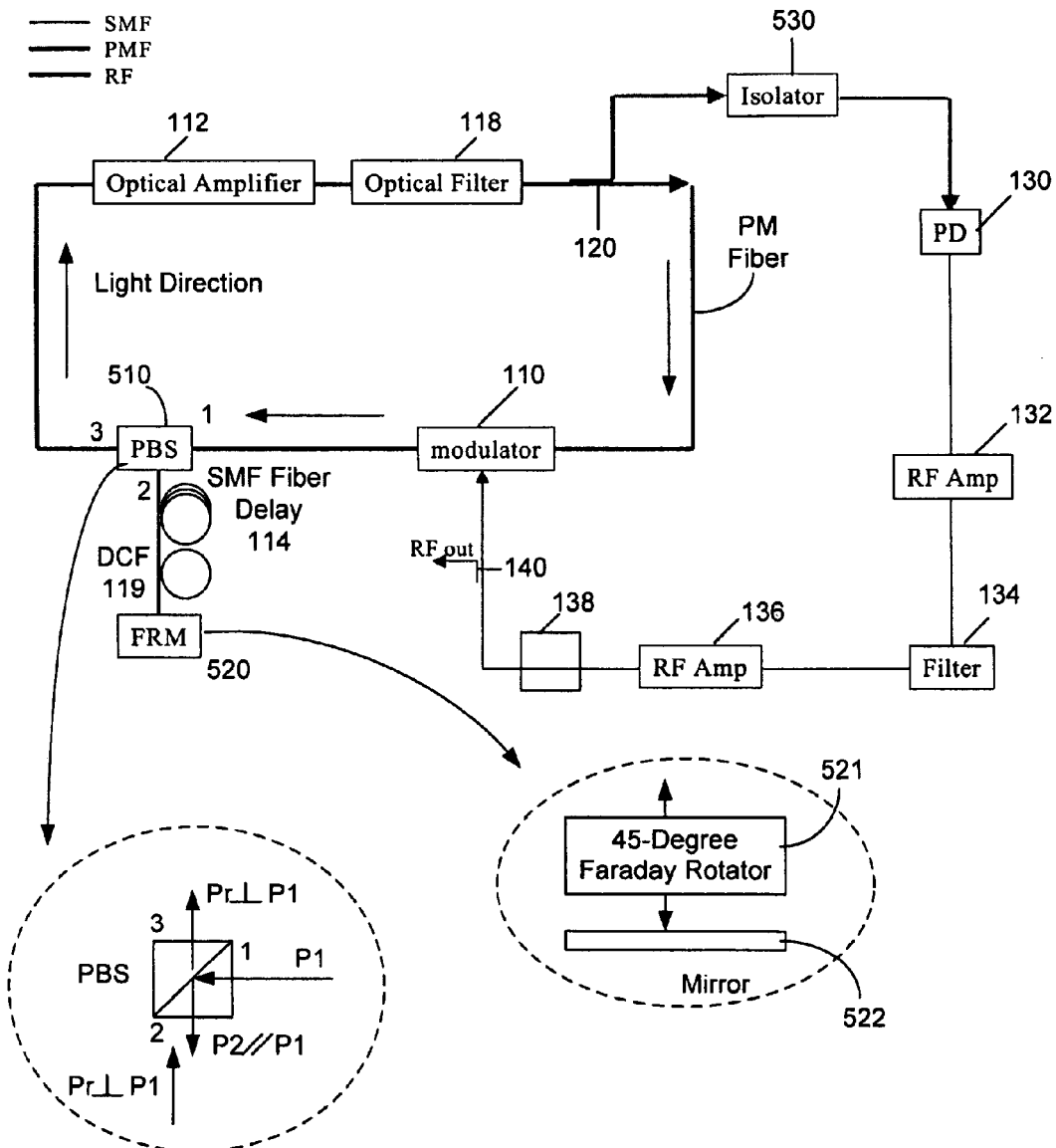
FIGS. 5 and 6 show two implementations of coupled opto-electronic oscillators that use a polarization beam splitter and a Faraday rotator to control the polarization inside the optical loop and to reduce the polarization-sensitive optical loss.

FIG. 5 shows an alternative implementation where the fiber ring 101 is constructed by using PM fiber which is coupled to each polarization-sensitive component in the ring 101 to minimize the polarization-sensitive loss locally. For optical components in which the polarization of light is difficult to control, the COEO in FIG. 5 places these non-PM optical components between a polarization beam splitter (PBS) 510 and a Faraday rotator 521 to optically isolate these non-PM optical components from each optical path where the polarization of light is required to be maintained at a certain polarization state and thus to minimize effects of these optical components on each of the polarization sensitive components in the ring 101.

As an example, many commercial single mode dispersion compensation fibers are not PM fibers. Therefore, the single mode fiber delay line 114 and the DCF 119 in FIGS. 1 and 2 may not maintain the polarization of light. The COEO in FIG. 5 places the single mode fiber delay line 114 and the DCF 119 between the PBS 510 in the ring 101 and a Faraday rotor mirror (FRM) 520 off the main PM fiber portion of the ring 101. The FRM 520 includes a 45-degree Faraday rotator 521 and a mirror 522. Light from the PBS 510 first transmit through the Faraday rotator 521 and is reflected by the mirror 522 to transmit the Faraday rotator 521 for the second time and is rotated by 90 degrees in polarization with respect to the incident polarization from the PBS 510. The PBS 510 has three ports 1, 2 and 3, respectively. The input port 1 is coupled to the PM fiber in the ring 101 so that the polarization (P1) aligned with the PM direction of the PM fiber is directed to the second port 2 (e.g., reflected to the port 2 by a polarization sensitive reflecting surface) as light in a polarization P2 which is the same as P1. The light output from the port 2 passes through the single mode fiber delay line 114 and the DCF 119 and is reflected back (Pr) by the Faraday rotator mirror 520 to be orthogonal to the incident polarization at each location between the PBS 510 and the Faraday rotator mirror 520. Therefore, the polarization (Pr) of the light reflected back to the PBS 510 at the port 2 is orthogonal to the polarization (P2) of light output at the port 2 by the PBS 510. Accordingly, the reflected light transmits through polarization sensitive reflecting surface of the PBS 510 to the port 3. The port 3 is coupled to the PM fiber in the ring 101 so that the polarization of light output at the port 3 is along the PM direction of the PM fiber in the ring 101. With reference to the polarization direction of the PBS 510, the two PM fiber segments respectively coupled to the ports 1 and 3 are oriented 90 degrees relative to each other.

Hence, the portion of the ring 101 between the BPS 510 and the FRM 520 is the non-PM portion of the ring and the rest of the ring 101 is the PM portion due to the use of PM fiber. In operation, light in the ring 101 is directed out of the PM portion of the ring 101 via the port 1 of the PBS 510 to the elements 114, 119 and 520 and is directed back into the PM portion of the ring 101. This design isolates any variation in the polarization of light in the non-PM portion between the PBS 510 and the FMR 520 from affecting the light polarization in the PM portion of the ring 101 because the light that is coupled back the PM portion by the port 3 of the PBS 510 is always aligned to the PM direction of the PM fiber. Notably, the light passes through the single mode fiber delay line 114 and the DCF 119 twice in one roundtrip in the ring 101 so that effect on the light by each of the single mode fiber delay line 114 and the DCF 119 is doubled. This allows the length of each of the single mode fiber delay line 114 and the DCF 119 to be reduced by one half in comparison of the designs in FIGS. 1 and 4 where light only passes through the single mode fiber delay line 114 and the DCF 119 only once in one roundtrip in the ring 101.

Figure 6:
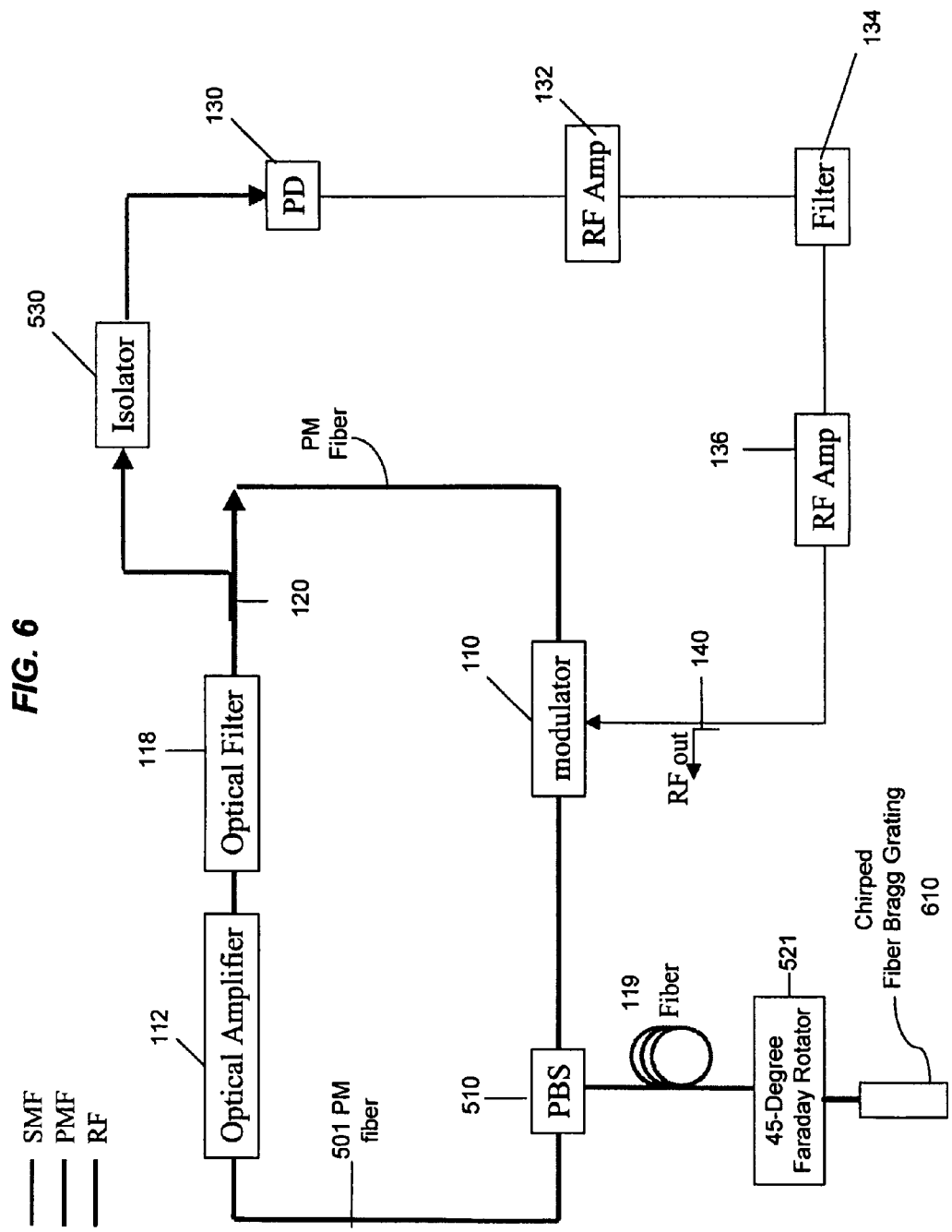

FIG. 6 shows a variation of the design in FIG. 5 where the a reflective Fiber Bragg grating 610 is used to replace the DCF 119 and the mirror 522 in FIG. 5. The fiber Bragg grating 610 is placed at the location of the mirror 522 to reflect light back and to produce negating dispersion that reduces the overall dispersion in the ring 101.

In the above examples, the optical fiber delay line 114 is used to produce the majority of the optical delay in the opto-electronic feedback. A high-Q optical resonator may be used to replace the optical fiber delay line 114 in the above and other implementations described in this application. Examples of COEOs using an optical resonator as an optical delay and their operations are described in U.S. Pat. No. 6,567,436 entitled "OPTO-ELECTRONIC OSCILLATORS HAVING OPTICAL RESONATORS" which is incorporated by reference as part of the specification of this application. Such an optical resonator is an integral part in the optical portion of the opto-electronic feedback loop to provide a sufficiently long energy storage time and hence to produce an oscillation of a narrow linewidth and low phase noise. The mode spacing of the optical resonator is equal to one mode spacing, or a multiplicity of the mode spacing, of the opto-electronic feedback loop. In addition, the oscillating frequency of the COEO is equal to one mode spacing or a multiple of the mode spacing of the optical resonator. Furthermore, the laser center frequency $V_{laser}$ of the laser light in the optical loop 101 is within one of the transmission peaks of the optical resonator. This optical resonator can also operate as an optical bandpass filter and the separate filter 118 may be eliminated from the ring 101. The optical resonator may be implemented in a number of configurations, including, e.g., a Fabry-Perot resonator, a fiber ring resonator, a whispering-gallery-mode microsphere resonator, a whispering-gallery-mode microdisc resonator, a whispering-gallery-mode microresonator in a non-spherical geometry.

Figure 7A:
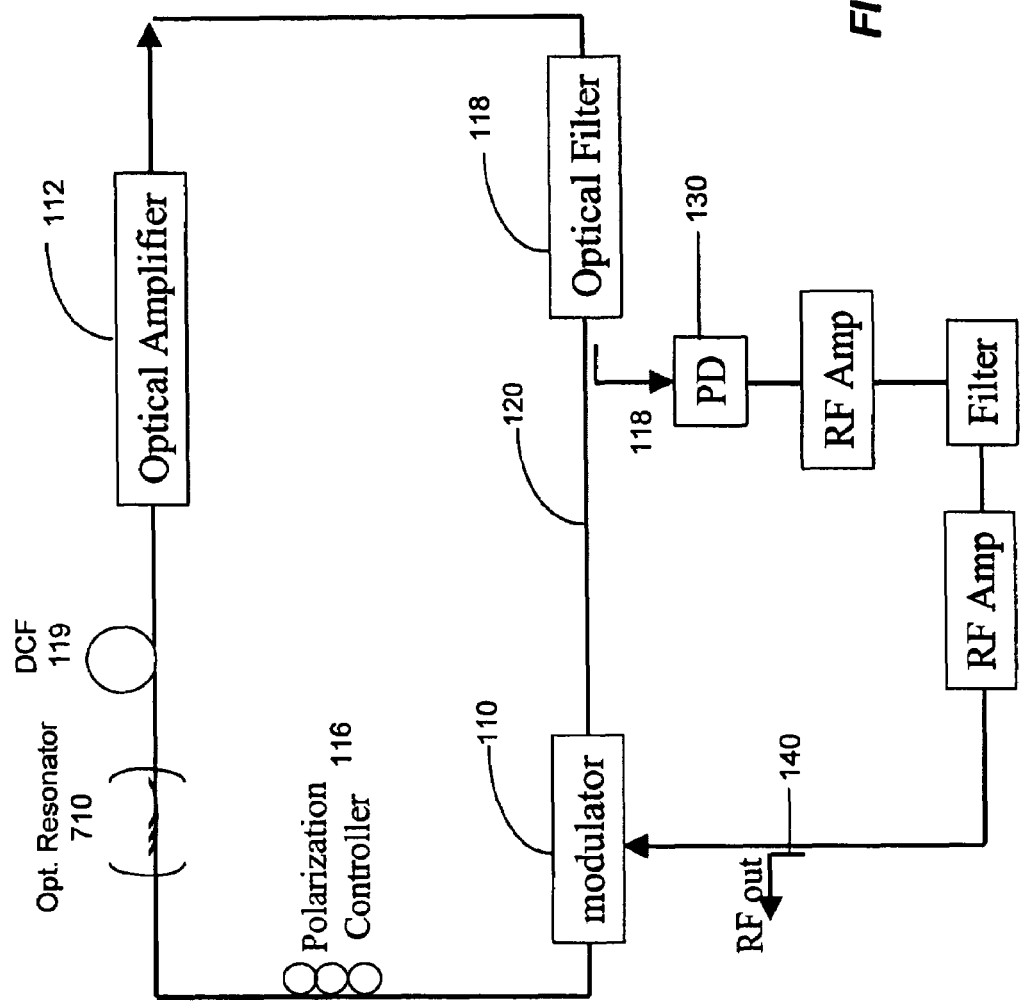
FIGS. 7A and 7B show two example of coupled opto-electronic oscillators that use an optical resonator to replace an optical fiber delay line.
Figure 7B:
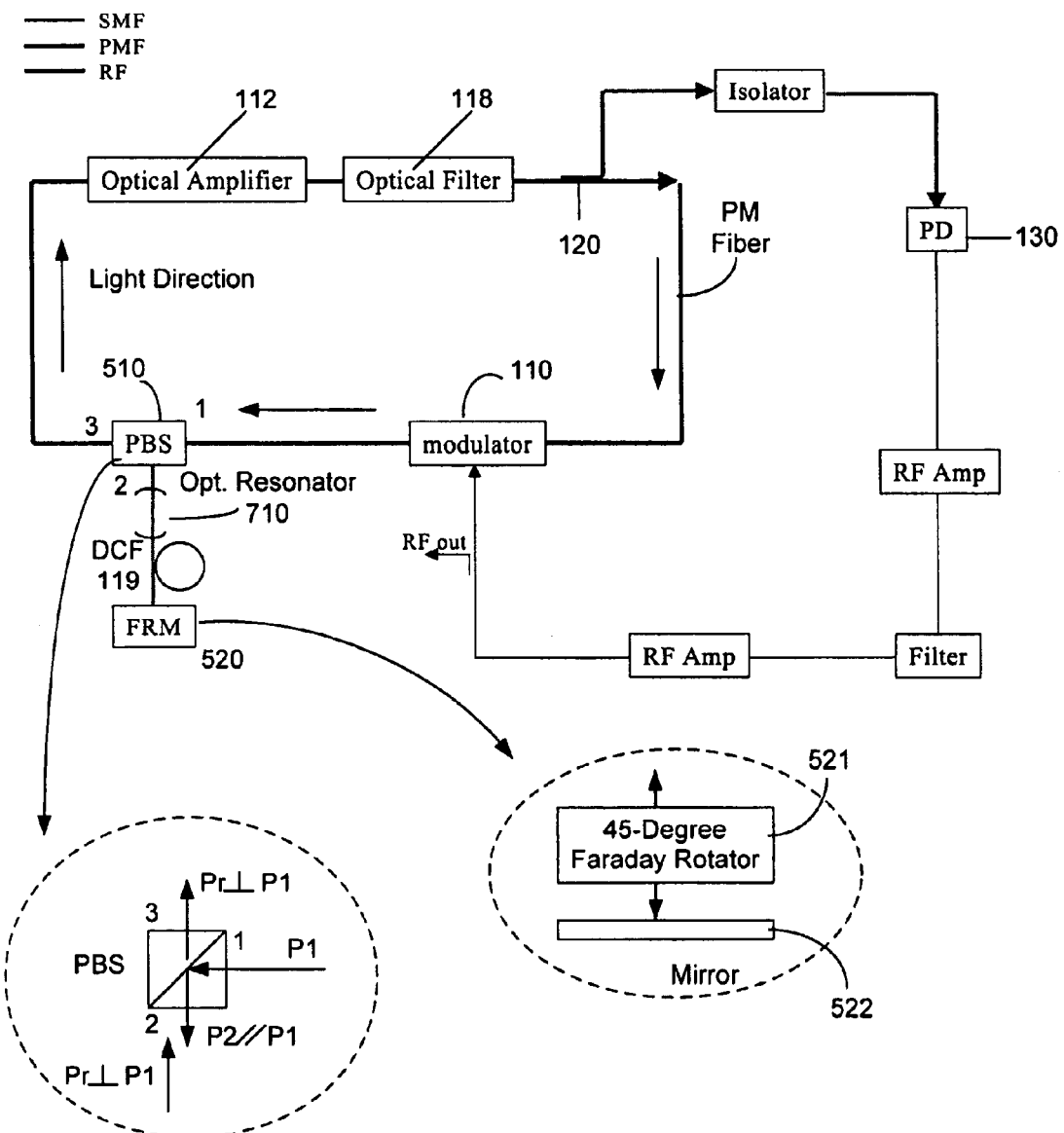

FIGS. 7A and 7B show two examples COEOS based on the COEOs in FIGS. 1 and 5, respectively. An optical resonator 701 is used to replace the fiber delay line 114. This technique can also be applied to other COEOs and their variations based on the specification of this application.

The above COEOs use a single opto-electronic feedback loop. In other implementations, the optical section of the single opto-electronic feedback loop may include two different optical paths with different optical delays to form a dual loop configuration to further restrict the optical mode selection and to reduce the number of spurious modes at the optical modes that are not selected for the laser oscillation in the COEO. Certainly, three or more optical paths may be used to form a multi-loop configuration to further eliminate the number of optical modes in the COEO. This use of two or more optical paths with different optical delays can improve the oscillator performance. U.S. Pat. No. 5,777,778 entitled "MULTI-LOOP OPTO-ELECTRONIC MICROWAVE OSCILLATOR WITH A WIDE TUNING RANGE" describes examples of multiloop OEOs and is incorporated by reference as part of the specification of this application. The different feedback loops in an OEO or COEO have different delays. The opto-electronic feedback loop with the longest delay is used to achieve low phase noise and narrow spectral linewidth. This loop is also used to provide fine frequency tuning since its mode spacing is smaller than any of the other feedback loops. On the other hand, the feedback loop with the shortest delay and the widest mode spacing is used to provide a coarse frequency tuning to achieve a wide continuous tuning range. The total open loop gain of the multiple loops must exceed the total losses to sustain an opto-electronic oscillation but each loop may have an open loop gain less then the loss in that loop.

Figure 8:
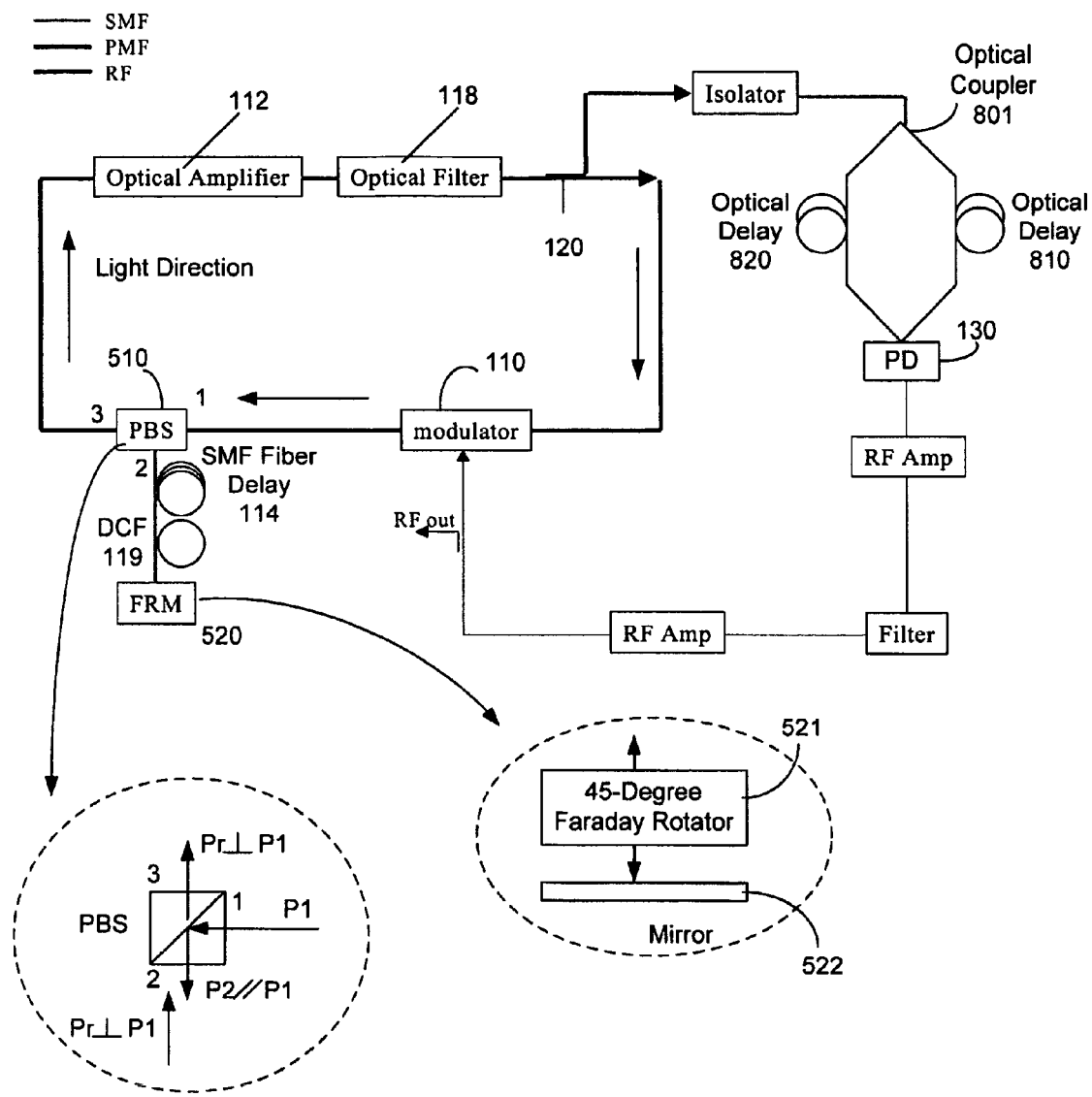
FIGS. 8, 9A, 9B and 9C show examples of coupled opto-electronic oscillators that two different optical paths and a single optical detector in the opto-electronic feedback loop to achieve improved oscillator performance.

FIG. 8 illustrates one example of a COEO based on the design in FIG. 5 to show an example of an opto-electronic feedback loop with two optical paths in the optical portion of the feedback loop. In this configuration, an optical coupler 801 is used to split the output of the laser light into two beams into two different optical delay lines 810 and 820, respectively. The two optical beams out of the two optical delay lines 810 and 820 are then combined at a single optical detector 130 which converts the combined optical signal into an electrical signal for processing by the electrical portion of the feedback loop. A polarization control mechanism is provided to make the two optical beams from two optical paths to be orthogonal to each other and thus the two beams at the optical detector 130 do not optically interfere. Accordingly, the electrical output of the optical detector 130 is a simple sum of the two delayed signals from the two optical paths 810 and 820. Notably, this design eliminates the optical interference between the two signals from the two optical paths but still allows for RF or microwave interference that leads to the improved oscillator performance.

In comparison with a multi-loop OEO or COEO that provides different optical paths with different optical detectors, the single-detector design in FIG. 8 keeps the number of the optical detectors at the minimum (i.e., only one detector) and thus reduces the circuit complexity, size and cost. The optical mode selection and optical filtering provided by the two or more different optical paths also relax the requirements of the electrical filtering with respect to at least the filtering bandwidth of an electrical filter in the electrical portion of the opto-electronic loop by allowing an RF filter with a relative wide bandwidth to be used without comprising the ability to achieve a narrow linewidth in the RF oscillation signal. These features are particular significant in integrated COEOs where various optical and electronic components are integrated on a common substrate.

Figure 9A:
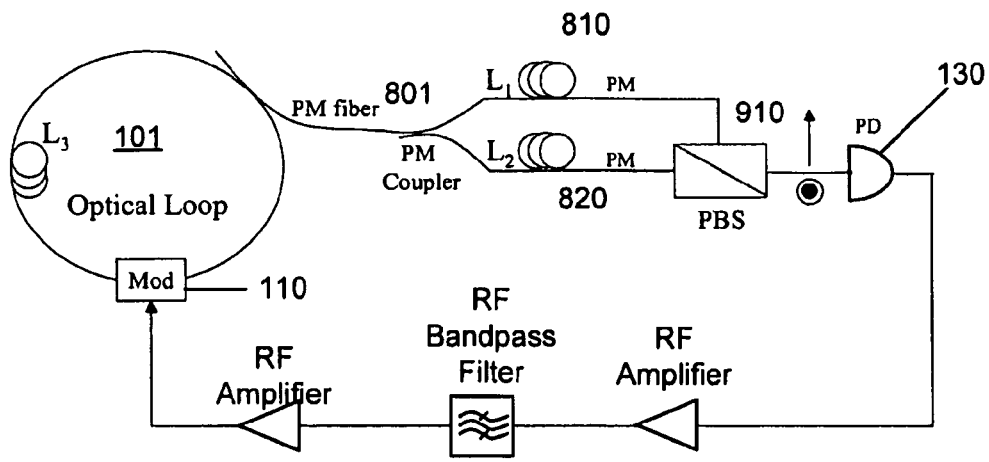
Figure 9B:
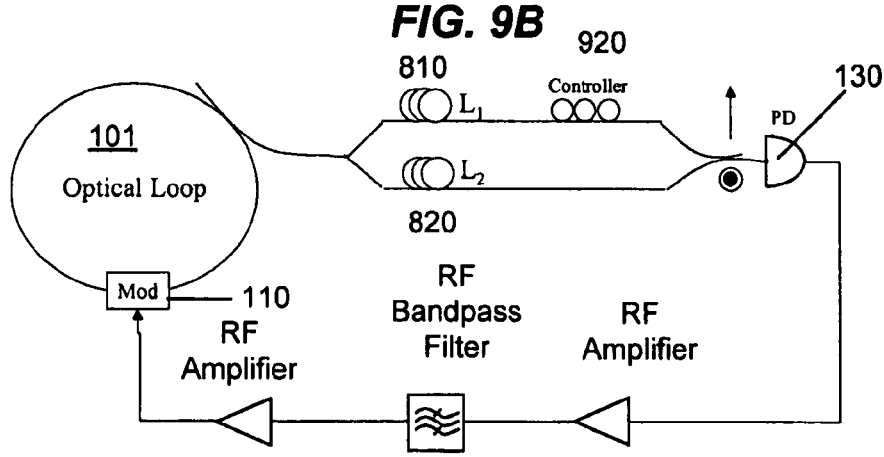
Figure 9C:
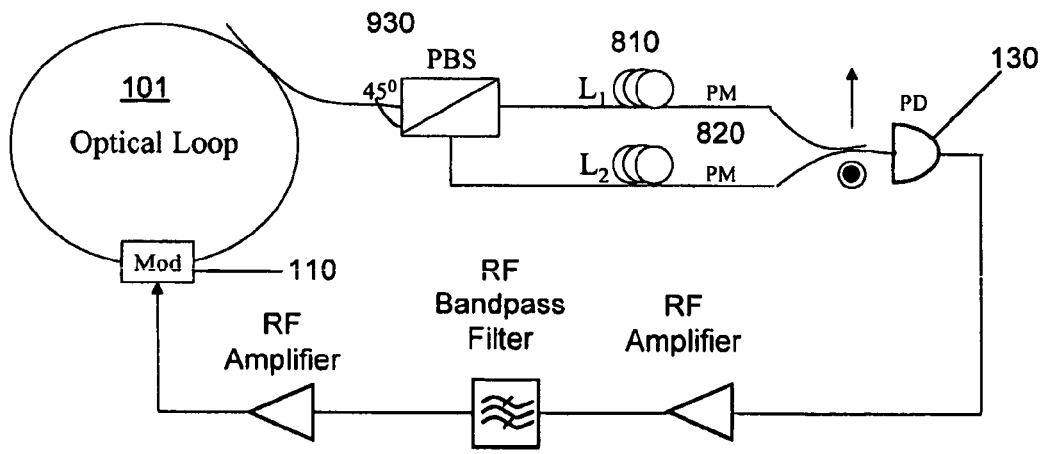
Figure 10:
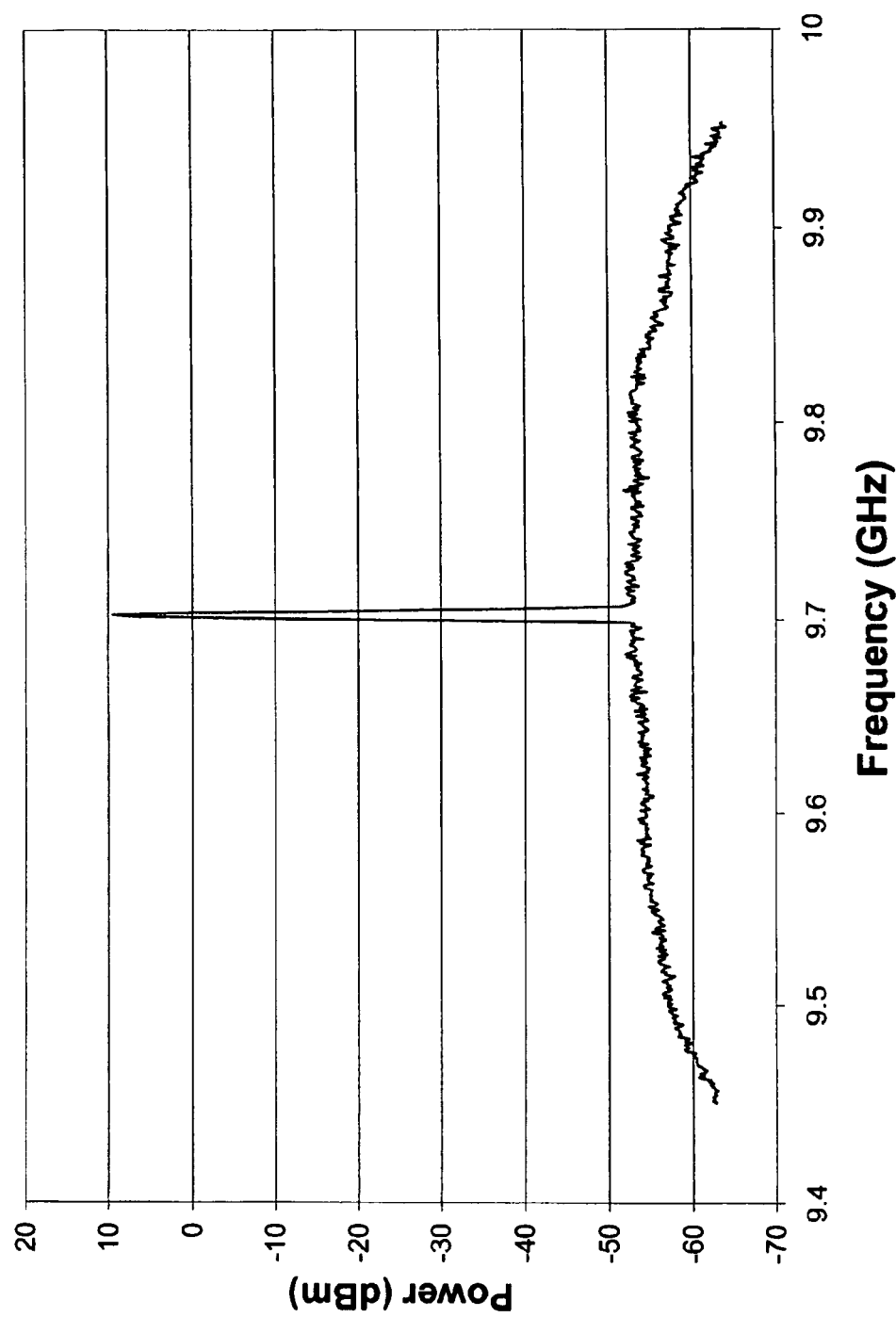
FIG. 10 shows a measured frequency spectrum of the COEO shown in FIG. 9A with two optical paths and a single optical detector in the opto-electronic feedback loop.

FIGS. 9A, 9B and 9C illustrate three different implementations of two optical paths and a single optical detector as shown in FIG. 8. In FIG. 9A, each optical path is formed with a PM fiber and the two different optical delay paths 810 and 820 have orthogonal polarizations. A PBS 910 is used as an optical polarization-sensitive combiner to combine the two orthogonally polarized beams into a single beam for detection at the single optical detector 130. In FIG. 9B, the optical paths use non-PM fibers such as single mode fibers and at least one polarization controller used in one of the two optical delay paths to ensure the two beams to be orthogonal to each other at the single optical detector 130. A polarization-insensitive optical coupler may be used to combine the two beams before the optical detector 130. In FIG. 9C, a PBS 930 is used as the optical coupler 801 to split the input light to the optical portion of the opto-electronic feedback loop into two orthogonally polarized beams. This may be achieved by orientating the polarization direction of the PBS 930 to be at an angle of 45 degrees with respect to the polarization of the input light. The two different optical paths are formed with PM fibers to maintain their respective polarizations. FIG. 10 shows a measured frequency spectrum of the COEO shown in FIG. 9A with two optical paths and a single optical detector in the opto-electronic feedback loop. The two optical delay paths use two PM fiber paths of 1 m and 650 m, respectively. The optical loop of COEO includes a single mode fiber of 1 km by using Corning's SFM-28 fiber. The RF filter used in the opto-electronic feedback loop has a bandwidth of 350 MHz. This COEO is functionally equivalent to a COEO with two separate loops of 1.65 km and 1 km in length, respectively. Notably, the RF oscillation signal near 9.7 GHz has a linewidth much narrower than the bandwidth of 350 MHz of the RF filter used in the electrical portion of the feedback loop.

Figure 11:
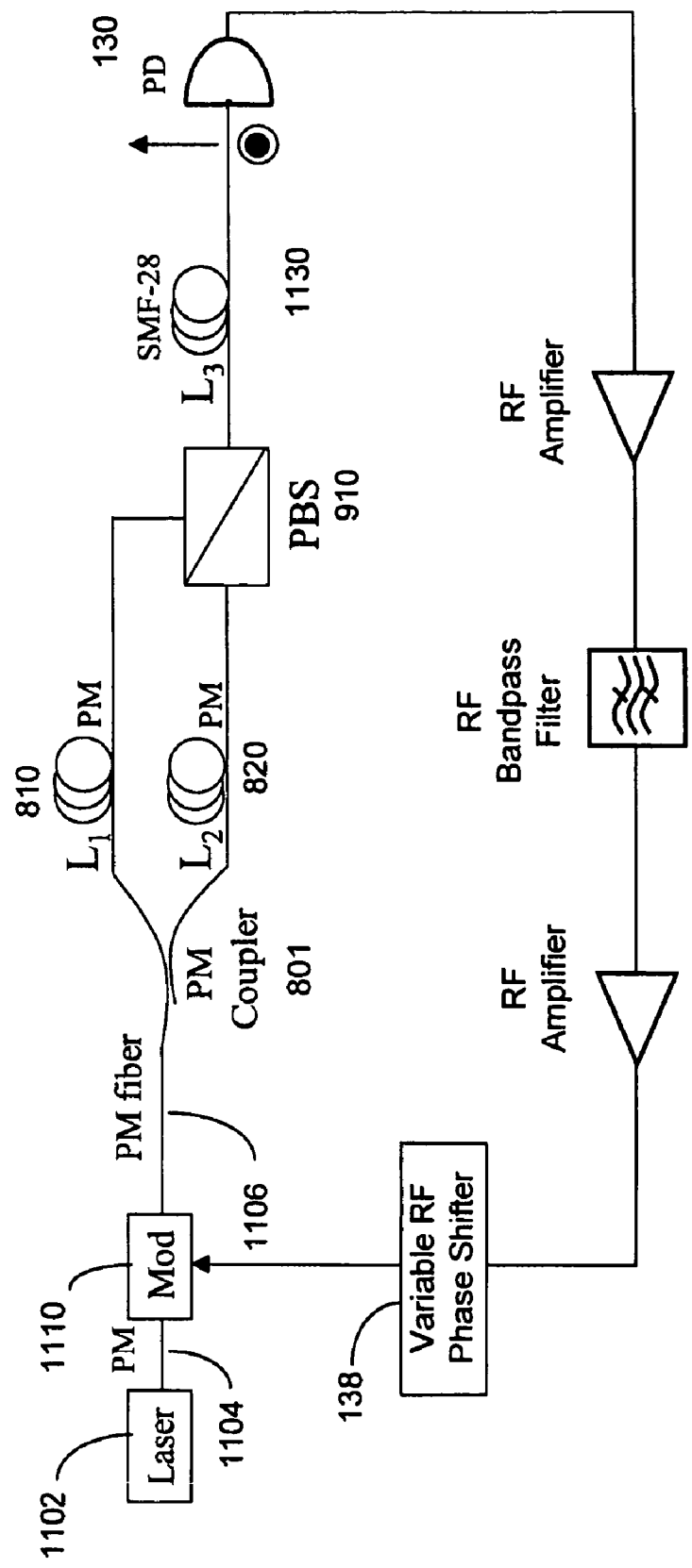
FIG. 11 shows one exemplary OEO in a non-COEO configuration where the design shown in FIG. 9A is used for the two optical delay paths and the single optical detector.

The designs of using multiple optical delay paths with a single optical detector in the opto-electronic feedback loop shown in FIGS. 8, 9A, 9B and 9C may be applied to other OEOs. FIG. 11 shows one exemplary OEO in a non-COEO configuration where the design shown in FIG. 9A is used for the two optical delay paths and the single optical detector. A laser 1101 is used to provide a CW laser beam into a PM fiber path 1104. An optical modulator 1110, which may be either an amplitude modulator or a phase modulator, is used to modulate the CW laser beam from the laser 1102 to produce a modulated beam in response to an electrical control signal from the opto-electronic feedback loop. A PM fiber path 1106 is provided to receive the modulated beam to the two optical delay paths 810 and 820. A fiber delay line 1130 of length L3 is placed between the PBS 910 and the single optical detector 130 to introduce an additional delay to the loop. This delay line 1130 may be replaced by an optical resonator as described above. The detector output from the detector 130 is electronically processed by the electrical portion of the loop to produce the electrical control signal applied to the optical modulator 1110. Alternatively, the OEO in FIG. 11 may be modified to use the configurations shown in FIGS. 9B and 9C for the two optical delay paths and the single optical detector.

Figure 12:
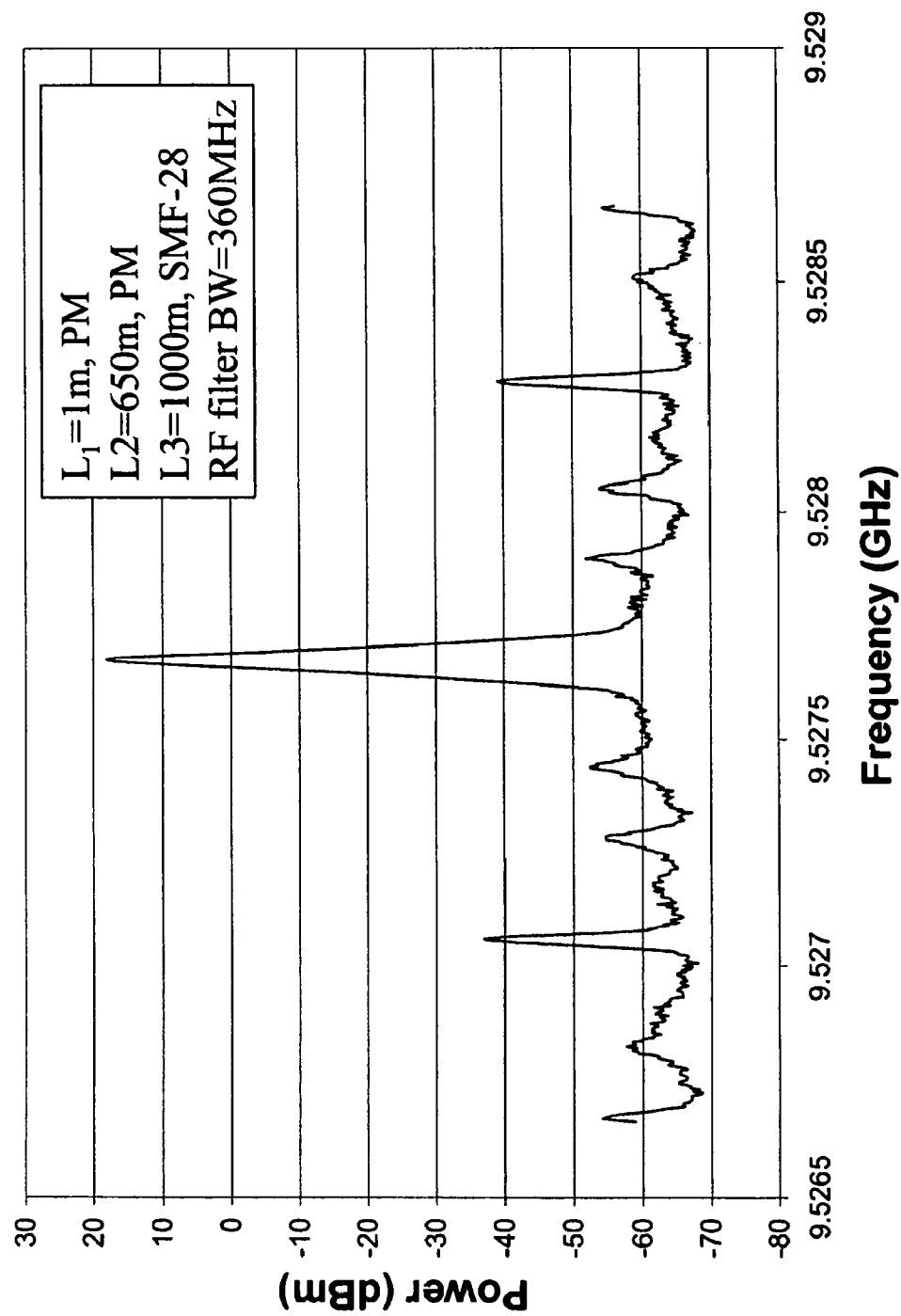
FIG. 12 shows a measured frequency spectrum of the OEO in FIG. 11 with two optical paths and a single optical detector in the opto-electronic feedback loop.

FIG. 12 shows a measured frequency spectrum of the OEO in FIG. 11 with two optical paths and a single optical detector in the opto-electronic feedback loop. The RF filter used in the opto-electronic feedback loop has a bandwidth of 360 MHz. Once again, the RF oscillation signal has a linewidth much narrower than the bandwidth of 360 MHz of the RF filter used in the electrical portion of the feedback loop.

The above described COEOs and OEOs may be configured as fixed oscillators which produce fixed oscillation frequencies in RF or microwave ranges or as tunable oscillators to tune the oscillation frequencies in response a control signal. A tunable COEO or OEO may be tuned by using a tunable optical delay device in the optical portion in the COEO or OEO, such as a fiber stretcher in a fiber delay line or a tunable optical resonator that is used as an optical delay element. An electro-optic material may be used in an optical resonator to make it tunable. A tunable COEO or OEO may also be tuned by using a tunable electrical device in the electrical portion of the opto-electronic feedback loop such as a variable RF delay device or a voltage controlled RF phase shifter. An OEO or COEO may also be tuned by using both an optically tunable device and an electrically tunable device.

In summary, only a few implementations are disclosed. However, it is understood that variations and enhancements may be made.

What is claimed is:

1. A device, comprising:
   a ring laser comprising an optical ring which comprises at least one optical gain medium operable to produce laser light;
   an optical modulator coupled in the optical ring and operable to modulate the laser light in response to a control signal to produce a modulated laser beam;
   an opto-electronic feedback loop comprising an optical portion operable to receive a portion of light from the ring laser, a photodetector operable to convert the received portion of light into a detector signal, and an electrical portion operable to produce the control signal from the detector signal; and
   a dispersion compensation element coupled in the optical ring and operable to compensate for optical dispersion in the optical ring.

2. The device as in claim 1, wherein the dispersion compensation element comprises a dispersion compensated fiber.

3. The device as in claim 1, wherein the dispersion compensation element comprises a dispersion shifted fiber.

4. The device as in claim 1, wherein the dispersion compensation element comprises a fiber Bragg grating.

5. The device as in claim 1, further comprising a polarization control unit coupled in the optical ring and operable to control a polarization of the laser light.

6. The device as in claim 1, wherein the optical ring includes polarization maintaining fiber which controls a polarization of the laser light.

7. The device in claim 1, further comprising an optical resonator in the optical ring.

8. The device as in claim 1, further comprising:
   an optical polarization beam splitter coupled in the optical ring to direct light received from the optical ring into a first light beam;
   a 45-degree Faraday rotator to receive and transmits the first light beam;
   a reflective unit to reflect the first light beam transmitted through the Faraday rotator back to the optical polarization beam splitter by transmitting through the Faraday rotator for a second time; and
   a fiber delay line between an optical path between the optical polarization beam splitter and the reflective unit to transport light,
   wherein the optical polarization beam splitter is coupled to the optical ring to direct light reflected back from the reflective unit into the optical ring.

9. The device as in claim 8, wherein the reflective unit is a mirror.

10. The device as in claim 8, wherein the reflective unit comprises a fiber Bragg grating.

11. The device as in claim 1, further comprising:
    an optical splitter to split the received portion of light from the ring laser into a first beam and a second beam;
    a first optical delay path to receive the first beam;
    a second optical delay path to receive the second beam, wherein the first and second optical paths have different optical delays,
    wherein the photodetector is coupled to receive the first and second beams, at orthogonal polarizations, from the first and second optical delay paths to produce the detector signal.

12. A method, comprising:
    selecting a length of an optical ring that generates laser light in a coupled opto-electronic oscillator (COEO) which further comprises an opto-electronic feedback loop coupled to the ring to produce a desired separation between a carrier frequency generated by the COEO and a first spurious mode generated by the COEO; and
    using a dispersion compensation element in the ring to negate optical dispersion in the ring to reduce phase noise of the COEO below an acceptable level.

13. The method as in claim 12, further comprising:
    controlling a polarization of the laser light in the optical ring.

14. A device, comprising:
    an optical loop which comprises at least one optical gain medium operable to produce laser light;
    an optical modulator coupled in the optical loop and operable to modulate the laser light in response to a control signal to produce modulated laser light;
    an opto-electronic feedback loop comprising an optical portion operable to receive a portion of the modulated laser light from the optical loop, a photodetector operable to convert the received portion into a detector signal, and an electrical portion operable to produce the control signal from the detector signal;
    an optical polarization beam splitter coupled in the optical loop to direct light received from the optical loop into a first light beam;
    a 45-degree Faraday rotator to receive and transmits the first light beam;
    a reflective unit to reflect the first light beam transmitted through the Faraday rotator back to the optical polarization beam splitter by transmitting through the Faraday rotator for a second time; and a fiber delay line between an optical path between the optical polarization beam splitter and the reflective unit to transport light, wherein the optical polarization beam splitter is coupled to the optical loop to direct light reflected back from the reflective unit into the optical loop.

15. The device as in claim 14, wherein the optical loop is formed from polarization maintaining fiber.

16. The device as in claim 14, further comprising:

an optical splitter to split the received portion of the laser light from the optical loop into a first beam and a second beam;

a first optical delay path to receive the first beam;

a second optical delay path to receive the second beam, wherein the first and second optical paths have different optical delays, wherein the photodetector is coupled to receive the first and second beams, at orthogonal polarizations, from the first and second optical delay paths to produce the detector signal.

17. A device, comprising:

a laser to produce CW laser light;

an optical modulator to modulate the CW laser light to produce modulated laser light in response to an electrical control signal;

an optical splitter to receive at least a portion of the modulated laser light and to split the received portion into a first beam and a second beam;

a first optical delay path to receive the first beam;

a second optical delay path to receive the second beam, wherein the first and second optical paths have different optical delays;

a photodetector coupled to receive the first and second beams, at orthogonal polarizations, from the first and second optical delay paths to produce a detector signal; and an electrical section operable to receive and process the detector signal to produce the electrical control signal, wherein the electrical section, the optical modulator, the optical splitter, the first and second optical delay paths, and the photodetector form a part of a closed opto-electronic feedback loop that is operable to have a loop gain greater than the loop loss and to generate an oscillation at a modulation frequency of the optical modulator.

* * * * *